(12) United States Patent
Weekly

(10) Patent No.: US 8,451,020 B2
(45) Date of Patent: May 28, 2013

(54) SYSTEM AND METHOD FOR INTEGRATED CIRCUIT MODULE TAMPERPROOF MODE PERSONALIZATION

(75) Inventor: Roger D. Weekly, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/894,325

(22) Filed: Sep. 30, 2010

(65) Prior Publication Data

US 2012/0081142 A1    Apr. 5, 2012

(51) Int. Cl.
*H03K 19/00* (2006.01)
(52) U.S. Cl.
USPC .............................. 326/8; 326/104
(58) Field of Classification Search
None
See application file for complete search history.

(56) References Cited

U.S. PATENT DOCUMENTS 5,369,299 A    11/1994 Byrne
5,566,107 A *  10/1996 Gilliam .......................... 365/200
6,396,759 B1 *  5/2002 Lesher .......................... 365/225.7
7,438,482 B2 * 10/2008 Asari et al. ...................... 385/89
2009/0314841 A1  12/2009 Tomoeda

FOREIGN PATENT DOCUMENTS

CA    2242777 A1    7/1997

OTHER PUBLICATIONS

Enisa; "Security Issues in the Context of Authentication Using Mobile Devices (Mobile eID)"; Google; Nov. 2008.
Common Criteria; "Requirements to Perform Integrated Circuit Evaluations"; Google; Sep. 2009.
Drimer-et al.; "Protecting Multiple Cores in a Single FPGA Design"; Google: 2007-2008.

* cited by examiner

*Primary Examiner* — Crystal L Hammond
(74) *Attorney, Agent, or Firm* — Hamilton & Terrile, LLP; Robert W. Holland

(57) ABSTRACT

A function of an integrated circuit is selectively disabled by mechanical intervention at a module that contains the integrated circuit, such as drilling a hole through the module, cutting a slot in the module or burning a hole with a laser through the laser. Mechanical destruction of the module at a predetermined spot disrupts a function enable signal that is otherwise provide through wires of the module to a connection with the integrated circuit. Without the function enable signal from the module wires to the integrated circuit connector, the function associated with the function enable signal cannot run on the integrated circuit.

20 Claims, 2 Drawing Sheets

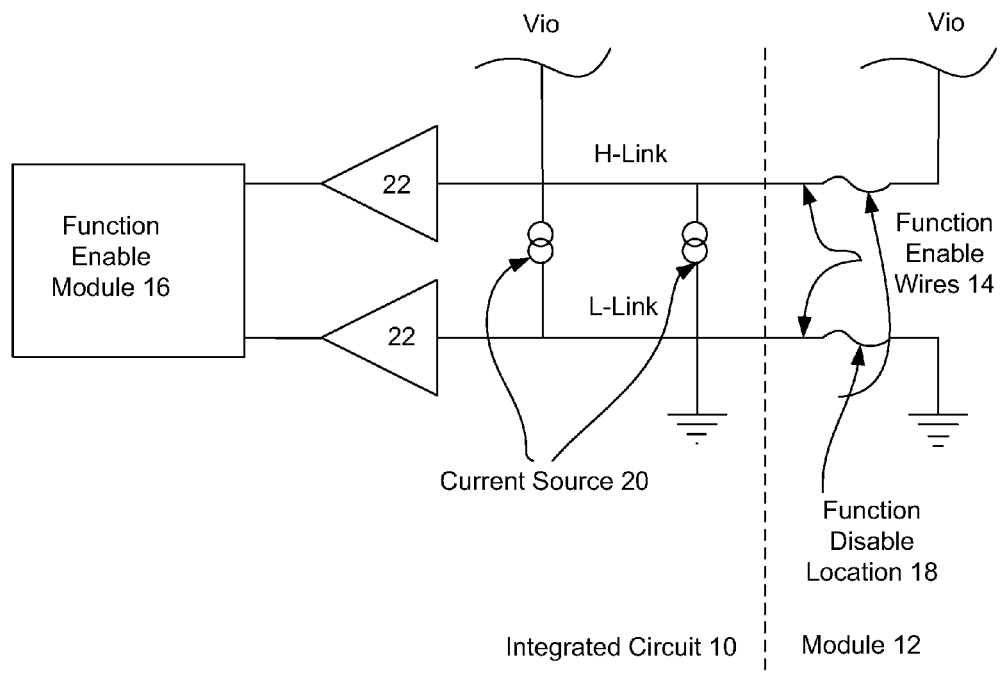
*Figure 1*
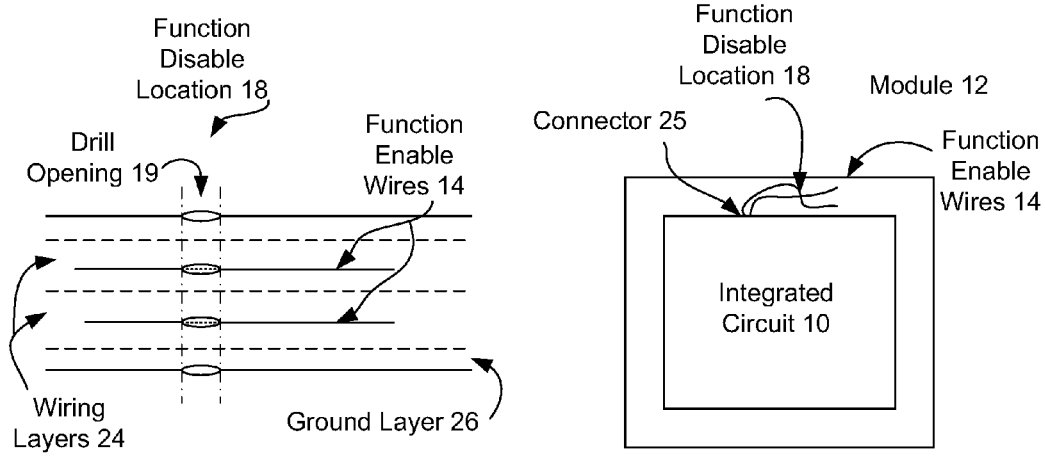
*Figure 2B*        *Figure 2A* ered to not have any readily visible indication of a function enable wire interdigitated within the module and other wire bundles. Multiple wire traces at each function disable location provides flexibility for enabling or disabling a function, such as by opening or shorting a function enable wire to a supply voltage or ground. Mechanical alteration of wire traces to enable or disable functions after assembly of the integrated circuit in the module provides personalization of the integrated circuit with reduced risk of unauthorized or inadvertent reversal of the personalization after the integrated circuit is put in use.

SYSTEM AND METHOD FOR INTEGRATED CIRCUIT MODULE TAMPERPROOF MODE PERSONALIZATION

BACKGROUND OF THE INVENTION

1. Field of the Invention

The present invention relates in general to the field of integrated circuit design, and more particularly to a system and method for integrated circuit module tamperproof mode personalization.

2. Description of the Related Art

Integrated circuits are typically manufactured by fabricating a number of "chips" on a wafer of semiconductor material, such as silicon, and then packaging the individual integrated circuit chips in modules. The modules typically provide wiring to connect circuits within the integrated circuit and external wiring, such as pins or a grid array that fit into a socket of a printed circuit board.

Integrated circuits perform processing and other functions with transistors etched into a semiconductor substrate and interconnected by wiring. Over time fabrication techniques have improved to build integrated circuits with greater numbers of transistors on a substrate of a given size. This has allowed integration levels that enable unprecedented performance and feature content in even the smallest physical system building blocks. For example, an integrated circuit having relatively small footprints can include encryption features that enhance the security of the system that uses the integrated circuit.

Much of the expense of manufacture of an integrated circuit is in the design of the integrated circuit. Often, a common integrated circuit design is sold to different market segments by selectively enabling and disabling features on the integrated circuit. For example, the integrated circuit has features selectively disabled by blowing "fuses" within the integrated circuit as part of the manufacture process. Including fuses reduces design expense by allowing a common design to have different features enabled. For instance, fuses built into an integrated circuit can selectively disable encryption features in order to comply with export control laws that restrict the sale of integrated circuits with encryption technology. Essentially, the integrated circuit is personalized at manufacture to include only selected features.

Typically fuses are blown at final wafer test although access can be included in modules so that fuses are blown during module test. One difficulty with blowing fuses at module test is that end users may also have access to a fuse blow port of the module so that accidental or malicious reconfiguration of the data blown into a fuse array of the integrated circuit might result in enablement of features meant to be disabled. However, having a module port for blowing fuses at module test or even post-module test provides greater flexibility in the manufacture and distribution of integrated circuit products.

SUMMARY OF THE INVENTION

Therefore, a need has arisen for a system and method which provides personalization or integrated circuit features and performance content at a module that contains the integrated circuit.

In accordance with the present invention, a system and method are provided which substantially reduce the disadvantages and problems associated with previous methods and systems for personalization of features and performance content of an integrated circuit. Enablement of one or more features at an integrated circuit depend upon inputs from a module in which the integrated circuit is assembled. The features are selectively disabled by mechanically altering the module to disrupt the inputs from the module, such as by drilling, cutting or burning the module to alter the inputs that are required to enable the feature.

More specifically, an integrated circuit is assembled in a module so that function enable wires of the module provide function enable signals at predetermined integrated circuit connectors. The function enable signals are decoded by an enable module of the integrated circuit to enable predetermined functions, such as encryption. To permanently disable the functions, the module is mechanically altered to disrupt the function enable signals. For example, the module is drilled, cut or burned at a function disable location to cut function enable wires that carry the function enable signal to the integrated circuit.

The present invention provides a number of important technical advantages. One example of an important technical advantage is that integrated circuits are personalized in a tamperproof method through a module assembly. Personalization of the integrated circuit after module assembly provides feature management, such as export compliance control, to disable features of an integrated circuit held by a module within the processor die without invoking firmware of the processor. Personalization after module test provides greater manufacturing flexibility with reading that can be strobed at power up for verification. Mechanical personalization by physical damage to interdigitated traces provides reliable disabling of integrated circuit functions that have little risk of reversal by unauthorized access or through intrinsic reliability or mechanism wearout.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

FIG. 1 depicts a circuit diagram of an integrated circuit assembled in a module with function enablement wires that are mechanically altered to selectively disable an associated function at the integrated circuit;

FIGS. 2A and 2B depict an example embodiment of an integrated circuit assembled in a module having function disable locations at which mechanical alteration of the module will result in disabling a selected function of the integrated circuit;

DETAILED DESCRIPTION

Figure 3:
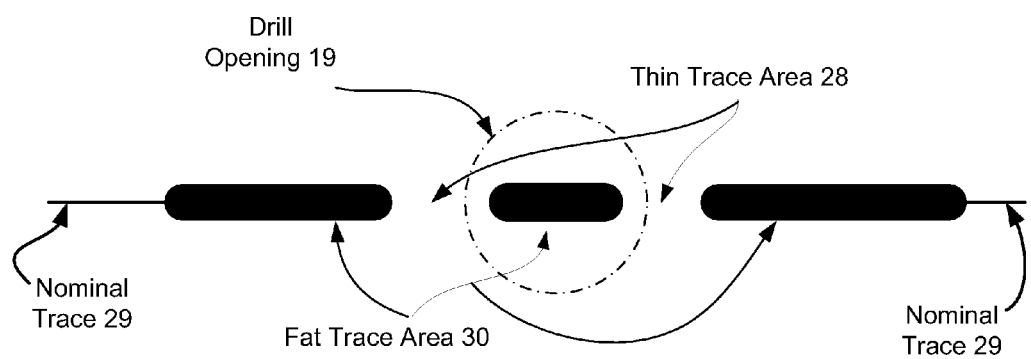
FIG. 3 depicts a non-uniform trace geometry for use as a function enable wire.

A system and method provides an interdigitated set of traces buried in a module carrier of an integrated circuit, the traces providing function enablement inputs to enable a function of the integrated circuit, such as encryption. The wire traces of the module have multiple wiring layers within a function disable location so that mechanical disruption of the function disable location removes the function enablement input from the integrated circuit to disable the function. Mechanical disruption of the set of wire traces is performed by drilling, cutting or burning with a laser to open or short the function enable wire trace paths so that functions and/or performance features associated with the function enable wires will not be available from the integrated circuit.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon. Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Referring now to FIG. 1, a circuit diagram depicts an integrated circuit 10 assembled in a module 12 with function enablement wires 14 that are mechanically altered to selectively disable an associated function at the integrated circuit 10. When intact, function enablement wires 14 provide inputs to enablement module 16 of integrated circuit 10 that logic of enablement module 16 decodes as authorization to enable a function of integrated circuit, such as encryption. When module 12 is mechanically altered at function disable location 18, the normal inputs to enable module 16 are altered so that the function is disabled. For example, enablement module 16 enables the function if a logical high signal is provided from H-link function enablement wire 14 through its connection to Vio and a logical low is provided from L-link function enablement wire 14 through its connection to ground. Mechanical alteration at function disable location 18 is performed in a number of ways, such as drilling, cutting a slot or burning with a laser to penetrate module 12 and cut function enablement wires 14. After the module material is penetrated to cut function enablement wires 14, the damage to module 12 may be repaired by filling the damaged area with insulation material.

In order to provide protection against tampering, additional features may be included in the integrated circuit and module to force a predetermined input to enablement module 16 if mechanical alteration is performed at function disable location 18. For example, if the values of H-link and L-link function enablement wires are equal to each other, integrated circuit 10 will detect an attempt to tamper with the function security feature and will take appropriate action, such as reporting tampering or disabling the function. Function enablement wires 14 are biased with low current at an integrated circuit current source 20 so that an open on either function enablement wire 14 will force the signal as seen by integrated circuit 10 receivers 22 to change state. The strength of the current source pull up is weak relative to the pull down current source so that shorting them together when function enablement wires 14 are open results in inputs at the same logic level that are resolvable by receivers 22, as opposed to floating at an unknown logic state. H-link function enablement wire 14 is made with a more resistive trace than L-link function enablement wire 14 to help assure that if the function enablement wire traces are shorted together but not disconnected from Vio and ground, the inputs to integrated circuit 10 would remain resolvable and at the same logic level, in this case ground.

Referring now to FIGS. 2A and 2B, an example embodiment is depicted of an integrated circuit 10 assembled in a module 12 having function disable locations 18 at which mechanical alteration of the module will result in disabling a selected function of the integrated circuit 10. FIG. 2A depicts a top view of an integrated circuit and module assembly having a function disable location at which entry of a drill into module 12 will result in destruction of one or both of the function enablement wires 14 to disable a function of integrated circuit 10. FIG. 2B depicts a side cutaway view of the integrated circuit and module assembly to show that function enablement wires 14 pass through different wiring layers to coincide proximate to each other near function disable location 18. FIG. 2B depicts a drill opening 19 formed through module 12 so that both function enable wires 14 are left open where drill opening 19 is formed. Module 12 in the area of mechanical alteration near function disable location 18 does not include other power or signal wires that might be damaged inadvertently by mechanical alteration. Integrated circuit 10 is assembled in module 12 so that function enable wires 14 connect to predetermined connectors 25 of integrated circuit 10. The integrated circuit and module assembly are tested to include testing of the function enabled by function enable wires 14 and then stored as inventory. At this point in the manufacture process, integrated circuit 10 receives a logic high and a logic low from the function enablement wires 14 so that the function is enabled at integrated circuit 10. Once the integrated circuit and module assembly is sold, the function is selectively disabled by drilling, cutting or burning module 12 at the function disable location. In one embodiment, function enablement wires 14 are placed in separate wiring layers 24 with an intervening ground layer 26 to help prevent subsequent attempts to reconnect broken function enablement wires. In one embodiment, the traces have a small size of 18 micrometers so that a very fine drill may be used to disrupt the wires. In an alternative embodiment, the area around function disable location 18 includes sensitive wiring or exists under a physical obstruction that makes tampering difficult.

Full tamperproof protection results by severing both function enable wires 14 to disable the function at integrated circuit 10. Mechanically repairing module 12, such as by filling drill opening 19 with insulation does not electrically repair function enable wires 14 but rather helps to make the severed wires less accessible to dissuade attempts to repair function enable wires 14. The placement of function enable wires 14 helps to ensure that the function is enabled at integrated circuit 10 only if function enable wires remain untouched. Once function enable wires 14 are severed, function enable module 16 will sense attempts to reconnect the wires and report tampering. In the example embodiment, function enable module 16 enables the associated function only if both function enable wires are connected with one function enable wire 14 pulled high and the other pulled low. The placement of function enable wires 14 relative to each other and to ground layers 26 or other module attributes, like differences in trace resistivity, makes reconnection of function enable wires 14 nearly impossible once they are severed and detectable my function enable module 16 through analysis of the signals at each wire. For example, a short on either function enable wire instead of an open circuit will alter the input made at function enable module 16 to indicate than an attempt was made at reconnection of the function wires. In alternative embodiments, the decode of function enable module 16 can require more than two function enable wires, thus making repair more difficult.

Referring now to FIG. 3, a non-uniform trace geometry is depicted for use as a function enable wire. Use of a non-uniform trace geometry improves reliability for disabling a function. A non-uniform trace will tend to tear and remove accessibility to the trace when the module is mechanically altered to disrupt a function enable wire. The thin portions 28 of the trace are, for instance, subject to tearing when drilled while the fat portions 30 of the trace acts as an anchor in the laminate of the module. For example, drilling at drill opening 19 will remove a portion of the fat trace area 30 while causing practically impossible to repair damage in the thin trace area 28. The non-uniform traces connect with nominal traces 29 that are used through the module. By surrounding the non-uniform trace with ground planes, drilling through the ground plane into the trace increase the likelihood that the trace will ground to disrupt the function enablement signal.

Figure 4:
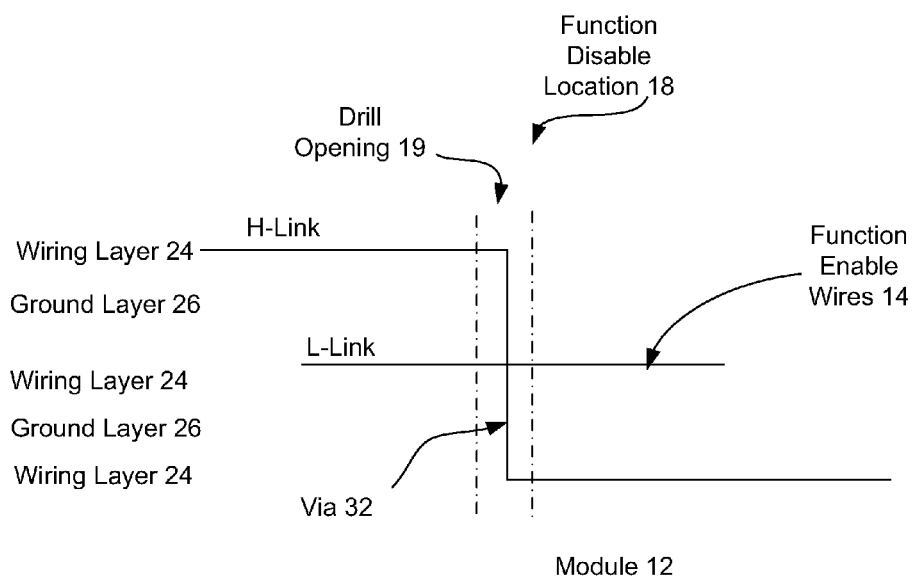
FIG. 4 depicts a via centered function disable structure.

Referring now to FIG. 4, a via centered function disable structure is depicted. A via 32 disposed in module 12 conducts an H-link function enable wire 14 from a first wiring layer 24 through ground wiring layers 26 to a second wiring layer 24. Via 32 runs through an opening formed in L-link function enable wire 14 at the function disable location. By using a via centered trace of one function enable wire to transverse from a wiring layer on one side of the other function enable wire to the other side at the function disable location 18, mechanical alterations, such as drilling at the function disable location, are more difficult to repair. Multiple stacks of wiring layers and vias may be used to increase repair difficulty and thus secure the permanent disabling of the function at the integrated circuit. Drill opening 19 depicts the portion of both function enable wires 14 that would be removed by drilling at via 32.

Although the present invention has been described in detail, it should be understood that various changes, substitutions and alterations can be made hereto without departing from the spirit and scope of the invention as defined by the appended claims.

What is claimed is:

1. A method for disabling an integrated circuit from performing a function, the method comprising:
   assembling the integrated circuit in a module;
   interfacing one or more function enablement wires embedded in the module with the integrated circuit, the functional enablement wires providing a signal to enable the function; and
   mechanically altering the module to disrupt the signal of one or more of the one or more function enablement wires.

2. The method of claim 1 wherein mechanically altering further comprises drilling through at least a portion of the module at the location of the one or more function enablement wires.

3. The method of claim 1 wherein mechanically altering further comprises cutting a slot in the module at the location of the one or more function enablement wires.

4. The method of claim 1 wherein mechanically altering further comprises illuminating the module with a laser to burn through the module at the location of the one or more function enablement wires.

5. The method of claim 1 further comprising repairing the mechanically altered module with insulating material to encapsulate the function enablement wires.

6. The method of claim 1 wherein the function enablement wires comprises an interdigitated set of traces disposed in multiple layers of the module.

7. The method of claim 1 wherein the function enablement wires comprise a non-uniform trace geometry.

8. The method of claim 1 wherein the function enablement wires comprise a first wire in a first wiring layer of the module, the first wiring layer adjacent to first and second ground layers.

9. The method of claim 1 wherein the function enablement wires comprise at least a first wire that transitions from a first wiring layer of the module to a second wiring layer through a via and wherein mechanically altering further comprises removing module material at the location of the via.

10. A module for containing an integrated circuit, the module comprising:
   a frame sized to contain the integrated circuit;
   one or more wiring layers disposed in the frame, each wiring layer having one or more wires operable to communicate signals with the integrated circuit;
   first and second function enablement wires disposed in the one or more wiring layers, the function enablement wires operable to provide a first and second function enable signal to the integrated circuit that enables a function of the integrated circuit; and
   a function disable location disposed on the frame and operable to accept a mechanical alteration that disrupts the first and second function enable signals to disable the function.

11. The module of claim 10 wherein the function disable location comprises a location to accept a drill, the frame having an opening drilled at the function disable location, the opening disrupting the first and second function enable signals to disable the function.

12. The module of claim 10 wherein the function disable location comprises a location to create a slot in the frame, the frame having a slot at the function disable location, the slot disrupting the first and second function enable signals to disable the function.

13. The module of claim 10 wherein the first function enable signal comprises a logical high and the second function enable signal comprises a logic low.

14. The module of claim 10 further comprising a ground wiring layer proximate to the first functional enablement wire and operable to disrupt the first function enable signal to a logic low upon mechanical alteration at the function disable location.

15. The module of claim 10 wherein the function comprises encryption performed by the processor.

16. The module of claim 10 wherein at least one of the first and second function enablement wires trace from a first to a second wiring layer through a via and the function disable location comprises the via.

17. A method for managing a function performed by an integrated circuit assembled in a module, the method comprising:
   connecting a first wire of the module to a first connector of the integrated circuit;
   connecting a second wire of the module to a second connector of the integrated circuit;
   enabling a function of the integrated circuit only if a predetermined first input is provided at the first wire to the first connector and a predetermined second input is provided at the second wire to the second connector; and
   destroying at least a portion of at least the first wire in the module to prevent the first input at the first wire to the first connector.

18. The method of claim 17 wherein destroying further comprises drilling through the module and into the first wire.

19. The method of claim 17 wherein destroying further comprising cutting a slot through the module to cut the first wire.

20. The method of claim 17 wherein destroying further comprises burning a hole through the module with a laser to cut the first wire.

* * * * *